(12) United States Patent
Qin et al.

(10) Patent No.: US 12,477,907 B2
(45) Date of Patent: Nov. 18, 2025

(54) DISPLAY PANEL, DISPLAY DEVICE, AND MANUFACTURING METHOD OF DISPLAY PANEL

(71) Applicant: Shenzhen China Star Optoelectronics Semiconductor Display Technology Co., Ltd., Guangdong (CN)

(72) Inventors: Shijian Qin, Guangdong (CN); Xialiang Yuan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 626 days.

(21) Appl. No.: 17/876,580

(22) Filed: Jul. 29, 2022

(65) Prior Publication Data

US 2024/0016007 A1  Jan. 11, 2024

(30) Foreign Application Priority Data

Jul. 5, 2022 (CN) .......................... 202210792632.0

(51) Int. Cl.
*H10K 59/123* (2023.01)
*H10K 59/12* (2023.01)
*H10K 59/122* (2023.01)
*H10K 59/124* (2023.01)
(Continued)

(52) U.S. Cl.
CPC ......... *H10K 59/123* (2023.02); *H10K 59/122* (2023.02); *H10K 59/124* (2023.02); *H10K 59/126* (2023.02); *H10K 71/00* (2023.02); *H10K 59/1201* (2023.02)

(58) Field of Classification Search
CPC ..... H10D 86/60; H10D 86/441; H10K 59/122
See application file for complete search history.

(56) References Cited

U.S. PATENT DOCUMENTS 9,548,344 B2    1/2017 Ahn et al.
2002/0063515 A1*  5/2002 Goto .................... H10K 50/856
                                                                313/500
(Continued)

FOREIGN PATENT DOCUMENTS

CN    105280681    1/2016
CN    107768412    3/2018
(Continued)

OTHER PUBLICATIONS

Notification of Office Action and Search Report Dated Feb. 28, 2025 From The State Intellectual Property Office of the People's Republic of China Re. Application No. 202210792632.0 and Its Translation Into English. (15 Pages).

*Primary Examiner* — Sue A Purvis
*Assistant Examiner* — Seyon Ali-Simah Punchbeddell

(57) ABSTRACT

The display panel includes a base substrate, an inorganic layer, a thin film transistor layer, and an anode layer. The inorganic layer is disposed on the base substrate, the thin film transistor layer is disposed on the inorganic layer, the thin film transistor layer is defined with a first opening, and the first opening exposes a part of the inorganic layer. The thin film transistor layer includes a source-drain layer, the anode layer is partially positioned on the part of the inorganic layer exposed by the first opening, and the anode layer is electrically connected to the source-drain layer.

15 Claims, 4 Drawing Sheets

(51) Int. Cl.
*H10K 59/126* (2023.01)
*H10K 71/00* (2023.01)

(56) References Cited

U.S. PATENT DOCUMENTS

| | | | | |
|---|---|---|---|---|
| 2016/0020262 | A1* | 1/2016 | Ahn | H10K 59/122 |
| | | | | 438/23 |
| 2019/0115408 | A1* | 4/2019 | Fang | H10K 59/122 |
| 2022/0208914 | A1* | 6/2022 | Lee | H10D 30/6729 |
| 2022/0320219 | A1* | 10/2022 | Zheng | H10K 71/00 |

FOREIGN PATENT DOCUMENTS

| | | | | |
|---|---|---|---|---|
| CN | 110098227 | | 8/2019 | |
| CN | 111129084 | A * | 5/2020 | |
| CN | 111341814 | A * | 6/2020 | G09G 3/3225 |

* cited by examiner

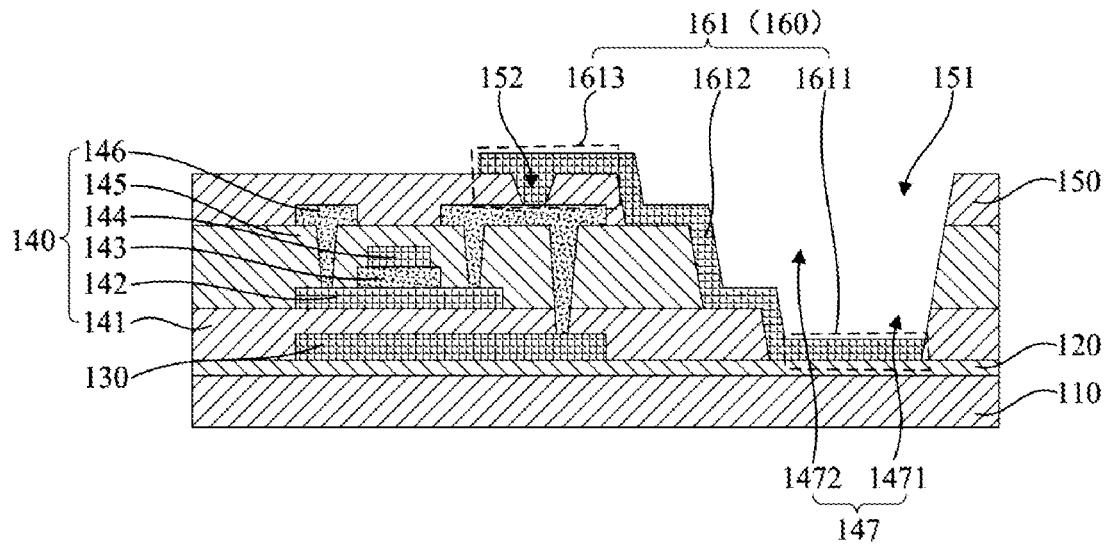

Forming a passivation layer on the thin film transistor layer, forming a second opening on the passivation layer at a position corresponding to the first opening, and forming a third opening on the passivation layer at a position corresponding to the source electrode; — S410

Depositing an anode layer on the passivation layer to cause the first body to be positioned on the part of the inorganic layer exposed by the first opening, cause the connecting part to be positioned on a side wall of the first opening and a side wall of the second opening, and cause the second body to be positioned on the passivation layer, wherein the second body is electrically connected to the source electrode through the third opening. — S420

FIG. 8

DISPLAY PANEL, DISPLAY DEVICE, AND MANUFACTURING METHOD OF DISPLAY PANEL

RELATED APPLICATION

This application claims the benefit of priority of China Patent Application No. 202210792632.0 filed on Jul. 5, 2022, the contents of which are incorporated by reference as if fully set forth herein in their entirety.

FIELD OF INVENTION

The present application relates to a field of display technology and particularly relates to a display panel, a display device, and a manufacturing method of the display panel.

BACKGROUND OF INVENTION

In a manufacturing process of current display panels, a planarization layer is usually formed on an array substrate to planarize a surface of the array substrate, and then an anode layer and a light emitting layer are formed on the planarization layer.

TECHNICAL PROBLEM

Because a surface roughness of the planarization layer in the current display panels is relatively large, a flatness of an anode layer deposited on a surface of the planarization layer is poor. As a result, a thickness uniformity of the light emitting layer is affected, which eventually leads to an uneven display of the display panel.

SUMMARY OF INVENTION

Embodiments of the present application provide a display panel, a display device, and a manufacturing method of the display panel, which can solve the problem of uneven display caused by the poor flatness of the anode layer in the current display panel.

An embodiment of the present application provides a display panel, including: a base substrate; an inorganic layer disposed on the base substrate; a thin film transistor layer disposed on the inorganic layer, wherein the thin film transistor layer is defined with a first opening, the first opening exposes a part of the inorganic layer, and the thin film transistor layer includes a source-drain layer; and an anode layer partially positioned on the part of the inorganic layer exposed by the first opening, wherein the anode layer is electrically connected to the source-drain layer.

Optionally, in some embodiments of the present application, the anode layer includes an anode, the anode includes a first body, a connecting part, and a second body connected in sequence, wherein the first body is positioned on the part of the inorganic layer exposed by the first opening, the connecting part is positioned on a side wall of the first opening, and the second body is electrically connected to the source-drain layer.

Optionally, in some embodiments of the present application, the display panel includes a light shielding layer positioned between the base substrate and the thin film transistor layer, wherein the thin film transistor layer includes a buffer layer, an active layer, a first insulating layer, a gate layer, a second insulating layer, and the source-drain layer sequentially arranged in a direction away from the light shielding layer, wherein the source-drain layer includes a source electrode electrically connected to the light shielding layer, and wherein the light shielding layer is positioned on the inorganic layer or is positioned in the same layer as the inorganic layer.

Optionally, in some embodiments of the present application, the display panel includes a passivation layer disposed on the thin film transistor layer, wherein a second opening is defined on the passivation layer at a position corresponding to the first opening, and a third opening is defined on the passivation layer at a position corresponding to the source electrode, wherein the second body of the anode is positioned on the passivation layer and is electrically connected to the source electrode through the third opening, and wherein the connecting part of the anode is positioned on the side wall of the first opening and a side wall of the second opening.

Optionally, in some embodiments of the present application, the display panel further includes a pixel definition layer and a light emitting layer, wherein the pixel definition layer is positioned on the passivation layer, a fourth opening exposing the first body is defined on the pixel definition layer, and wherein the light emitting layer is positioned on the first body.

Optionally, in some embodiments of the present application, a first sub-opening exposing the inorganic layer is defined on the buffer layer, a second sub-opening is defined on the second insulating layer at a position corresponding to the first sub-opening, and the first sub-opening and the second sub-opening form the first opening, and wherein a fifth opening exposing the light shielding layer is defined on the buffer layer, the second body of the anode layer is positioned on the buffer layer, the second body is electrically connected to the light shielding layer through the fifth opening, and the connecting part is positioned on a side wall of the first sub-opening.

Optionally, in some embodiments of the present application, a first sub-opening exposing the inorganic layer is defined on the buffer layer, a second sub-opening is defined on the second insulating layer at a position corresponding to the first sub-opening, and the first sub-opening and the second sub-opening form the first opening, and wherein a sixth opening exposing the light shielding layer is defined on the second insulating layer, the second body of the anode layer is positioned on the second insulating layer, the second body is electrically connected to the light shielding layer through the sixth opening, and the connecting part is positioned on a side wall of the first sub-opening and a side wall of the second sub-opening.

Optionally, in some embodiments of the present application, a material of the inorganic layer includes one or more materials selected from amorphous silicon, silicon nitride, silicon oxide, or silicon oxynitride.

Optionally, in some embodiments of the present application, a thickness of the inorganic layer is greater than or equal to 50 nm and less than or equal to 1000 nm.

Correspondingly, an embodiment of the present application further provides a display device, including any of the above-mentioned display panels.

Correspondingly, an embodiment of the present application further provides a method of manufacturing a display panel, including: providing a base substrate; depositing an inorganic layer on the base substrate; forming a thin film transistor layer on the inorganic layer, and forming a first opening on the thin film transistor layer to expose a part of the inorganic layer, wherein the thin film transistor layer includes a source-drain layer; and depositing an anode layer to cause the anode layer to be partially disposed on the part of the inorganic layer exposed by the first opening and cause the anode layer to be electrically connected to the source-drain layer.

Optionally, in some embodiments of the present application, the source-drain layer includes a source electrode, the anode layer includes an anode, and the anode includes a first body, a connecting part, and a second body connected in sequence. The step of depositing the anode layer to cause the anode layer to be partially disposed on the part of the inorganic layer exposed by the first opening and cause the anode layer to be electrically connected to the source-drain layer includes: forming a passivation layer on the thin film transistor layer, defining a second opening on the passivation layer at a position corresponding to the first opening, and defining a third opening on the passivation layer at a position corresponding to the source electrode; and depositing an anode layer on the passivation layer to cause the first body to be positioned on the part of the inorganic layer exposed by the first opening, cause the connecting part to be positioned on a side wall of the first opening and a side wall of the second opening, and cause the second body to be positioned on the passivation layer, wherein the second body is electrically connected to the source electrode through the third opening.

Optionally, in some embodiments of the present application, the method further includes forming a pixel definition layer on the passivation layer, defining a fourth opening exposing the first body on the pixel definition layer, and forming a light emitting layer on the first body.

Advantages

In the embodiment of the present application, the display panel includes a base substrate, an inorganic layer, a thin film transistor layer, and an anode layer. The inorganic layer is disposed on the base substrate, the thin film transistor layer is disposed on the inorganic layer, the thin film transistor layer is defined with a first opening, and the first opening exposes a part of the inorganic layer. The thin film transistor layer includes a source-drain layer, the anode layer is partially positioned on the part of the inorganic layer exposed by the first opening, and the anode layer is electrically connected to the source-drain layer. In the present application, the inorganic layer is disposed on the base substrate so that the inorganic layer and the base substrate form a planarization layer, and a first opening is defined on the thin film transistor layer to cause the anode layer to be partially positioned on the part of the inorganic layer exposed by the first opening. Thus, the flatness of the anode layer positioned on the inorganic layer is ensured. This improves the problem of uneven display of the display panel.

DESCRIPTION OF DRAWINGS

In order to illustrate the technical solutions in the embodiments of the present application more clearly, the following briefly introduces the accompanying drawings that need to be used in the description of the embodiments. Obviously, these drawings in the description are only some embodiments of the present application. For one skill in the art, other drawings can be obtained from these drawings without paying creative effort.

FIG. 7 is a schematic structural diagram of step S400 in FIG. 5 provided by an embodiment of the present application.

FIG. 8 is a flowchart of step S400 in FIG. 5 provided by an embodiment of the present application.

REFERENCE NUMERALS

10 display device; 1471 first sub-opening; 100 display panel; 1472 second sub-opening; 110 base substrate; 150 passivation layer; 120 inorganic layer; 151 second opening; 130 light shielding layer; 152 third opening; 140 thin film transistor layer; 160 anode layer; 141 buffer layer; 161 anode; 1411 fifth opening; 1611 first body; 142 active layer; 1612 connecting part; 143 first insulating layer; 1613 second body; 144 gate layer; 170 pixel definition layer; 145 second insulating layer; 171 fourth opening; 1451 sixth opening; 180 light emitting layer; 146 source-drain layer; 200 control circuit; 147 first opening; 300 casing.

DETAILED DESCRIPTION OF PREFERRED EMBODIMENTS

The technical solutions in the embodiments of the present application will be clearly described with reference to the drawings in the embodiments of the present application. Obviously, the embodiments are only a part of the embodiments of the present application, but not all the embodiments. Based on these embodiments in the present application, all other embodiments obtained by one skill in the art without doing creative work fall within the protection scope of the present application. In addition, it is noted that the specific embodiments described herein are only used to illustrate the present application, but not to limit the present application. In this application, unless otherwise stated, the use of directional words such as "upper" and "lower" generally refers to the upper and lower parts of the device in actual use or working state. Specifically refers to the direction in the attached drawing, and "inside" and "outside" refer to the outline of the device.

Embodiments of the present application provide a display panel, a display device, and a manufacturing method of the display panel. Each of them will be described in detail below. It is noted that the description order of the following embodiments is not intended to limit the preferred order of the embodiments.

Figure 1:
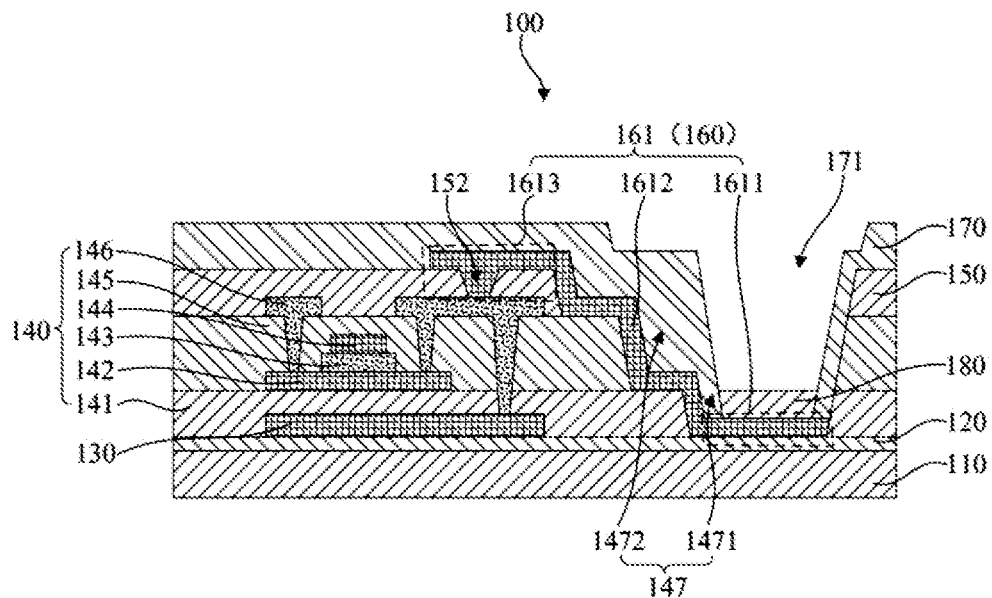
FIG. 1 is a schematic structural diagram of a display panel provided by an embodiment of the present application.
Figure 2:
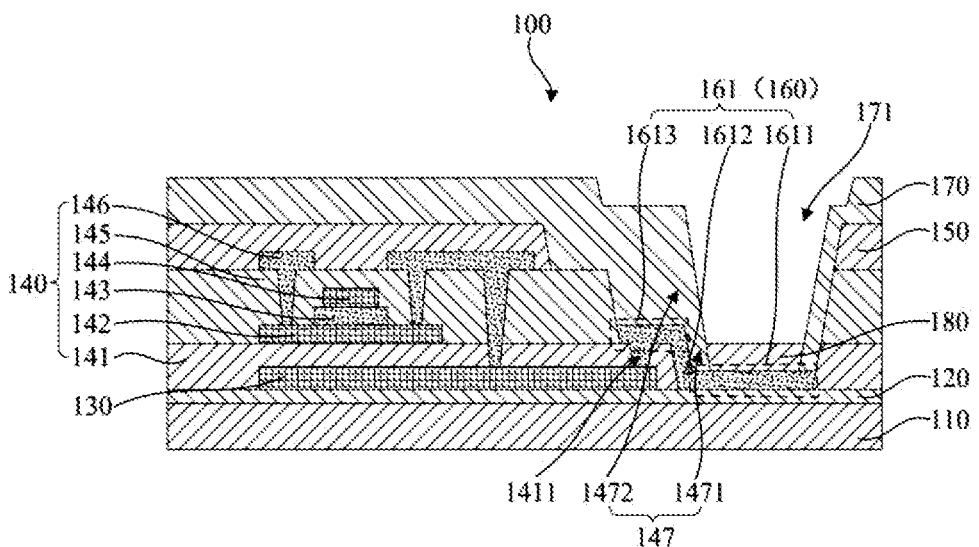
FIG. 2 is a schematic structural diagram of another display panel provided by an embodiment of the present application.
Figure 3:
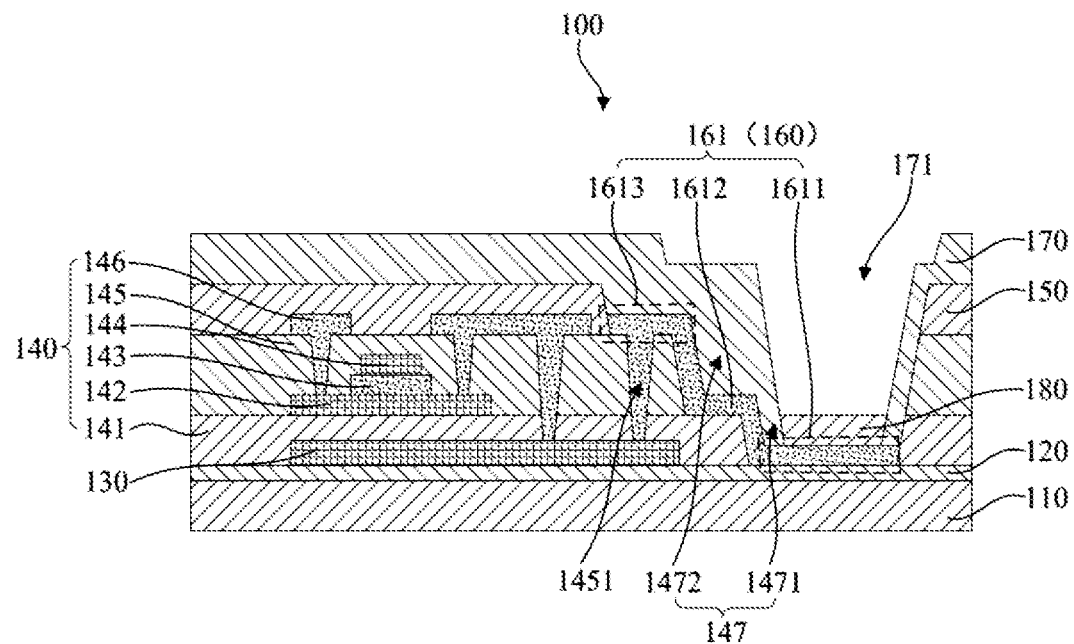
FIG. 3 is a schematic structural diagram of yet another display panel provided by an embodiment of the present application.

First, an embodiment of the present application provides a display panel, as shown in FIG. 1 to FIG. 3. The display panel 100 includes a base substrate 110. The base substrate 110 is served as a support structure of the display panel 100 to support other functional structural layers disposed on the base substrate 110 to ensure the overall structural stability of the display panel 100, wherein, the base substrate 110 may be a glass substrate or a substrate of other materials, which is not limited herein.

The display panel 100 includes an inorganic layer 120, and the inorganic layer 120 is disposed on the base substrate 110. Because the surface of the inorganic layer 120 has small roughness and good flatness, forming the inorganic layer 120 on the base substrate 110 can planarize the surface of the base substrate 110. The inorganic layer 120 and the base substrate 110 can be regarded as a planarization layer, which is helpful for the manufacture of subsequent film layers.

Figure 6:
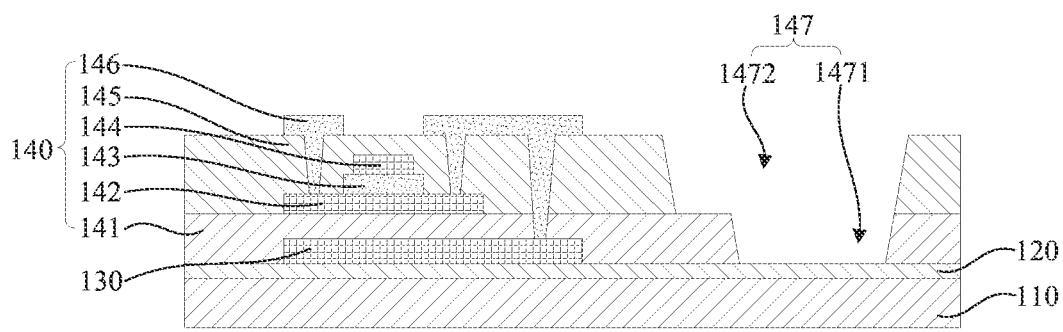
FIG. 6 is a schematic structural diagram of step S300 in FIG. 5 provided by an embodiment of the present application.

The display panel 100 includes a thin film transistor layer 140 disposed on the inorganic layer 120. As shown in FIG. 6, the thin film transistor layer 140 is defined with a first opening 147, and the first opening 147 exposes a part of the inorganic layer 120 to facilitate the formation of subsequent layers on the inorganic layer 120. The thin film transistor layer 140 includes a source-drain layer 146, and the source-drain layers 146 are used to connect with other film layers to realize the control of the thin film transistor layer 140 on other film layers.

The display panel 100 includes the anode layer 160. As shown in FIG. 7, the anode layer 160 is partially positioned on the part of the inorganic layer 120 exposed by the first opening 147. Because the inorganic layer 120 itself has small roughness and good flatness, the flatness of the anode layer 160 positioned on the inorganic layer 120 is good. This helps to improve the uniformity of the subsequent film layers, thereby improving the problem of uneven display of the display panel 100.

In addition, since the base substrate 110 contains various impurity ions, the base substrate 110 can be separated from the corresponding anode layer 160 by providing the inorganic layer 120 on the base substrate 110. This prevents impurity ions in the base substrate 110 from entering the anode layer 160, thereby preventing the display effect of the display panel 100 from being affected.

The anode layer 160 is electrically connected to the source-drain layer 146 in the thin film transistor layer 140, so that the anode layer 160 is electrically connected to the corresponding thin film transistor in the thin film transistor layer 140. This realizes the control of turn-on and turn-off of the signal on the anode layer 160, thereby realizing the regulation of the display mode of the display panel 100.

It should be noted that the electrical connection between the anode layer 160 and the source-drain layer 146 may be that the anode layer 160 is directly connected to the source-drain layer 146, or the anode layer 160 is indirectly connected to the source-drain layer 146 through other structures. The connection way is related to the specific structural design of the anode layer 160, which is not particularly limited herein.

In the embodiment of the present application, the display panel 100 includes a base substrate 110, an inorganic layer 120, a thin film transistor layer 140, and an anode layer 160. The inorganic layer 120 is disposed on the base substrate 110, the thin film transistor layer 140 is disposed on the inorganic layer 120, a first opening 147 is defined on the thin film transistor layer 140, and the first opening 147 exposes a part of the inorganic layer 120. The thin film transistor layer 140 includes a source-drain layer 146, the anode layer 160 is partially positioned on the part of the inorganic layer 120 exposed by the first opening 147, and the anode layer 160 is electrically connected to the source-drain layer 146. In the present application, the inorganic layer 120 is disposed on the base substrate 110 so that the inorganic layer 120 and the base substrate 110 form a planarization layer. A first opening 147 is defined on the thin film transistor layer 140 to cause the anode layer 160 to be partially positioned on the part of the inorganic layer 120 exposed by the first opening 147. Thus, the flatness of the anode layer 160 positioned on the inorganic layer 120 is ensured. This improves the problem of uneven display of the display panel 100.

Optionally, the anode layer 160 includes an anode 161, and the anode 161 includes a first body 1611, a connecting part 1612, and a second body 1613 that are connected in sequence. The first body 1611 is positioned on the inorganic layer 120 exposed by the first opening 147, and is used for the formation of subsequent film layers on the anode layer 160. The connecting part 1612 is positioned on the side wall of the first opening 147 to facilitate the connection of the first body 1611 and other structures. The second body 1613 is electrically connected to the source-drain layer 146 to realize the electrical connection between the anode 161 and the source-drain layer 146.

Wherein, the arrangement position of the second body 1613 can be adjusted according to the connection way of the anode 161 and the source-drain layer 146. When the arrangement position of the second body 1613 changes, the formation area of the connecting part 1612 on the side wall of the first opening 147 changes accordingly to ensure the electrical connection between the anode 161 and the source-drain layer 146.

Optionally, the display panel 100 includes a light shielding layer 130, and the light shielding layer 130 is positioned between the base substrate 110 and the thin film transistor layer 140. The thin film transistor layer 140 includes a buffer layer 141, an active layer 142, a first insulating layer 143, a gate layer 144, a second insulating layer 145, and a source-drain layer 146, which are sequentially disposed along a direction away from the light shielding layer 130. By arranging the light shielding layer 130 between the base substrate 110 and the thin film transistor layer 140, the light shielding layer 130 can be used to shield the external ambient light. This prevents the external ambient light from irradiating the active layer 142 and affecting the structure of the active layer 142. Therefore, the normal use of the thin film transistor layer 140 is prevented from being affected.

The source-drain layer 146 includes a source electrode, and the source electrode is electrically connected to the light shielding layer 130. That is, during the manufacturing process of the display panel 100, a through hole is defined on the second insulating layer 145, so that the source electrode is electrically connected to the light shielding layer 130 through the through hole. By electrically connecting the source electrode to the light shielding layer 130, it is helpful to optimize the design of the connection mode between the source electrode and other structures. In addition, the control of the signal input to the source electrode can also be realized through the design of the traces on the light shielding layer 130.

In some embodiments, the light shielding layer 130 is positioned on the inorganic layer 120. That is, the inorganic layer 120 is disposed on the entire surface of the base substrate 110, so that after depositing a layer of the inorganic layer 120 on the base substrate 110, the inorganic layer 120 does not need to be patterned, thereby reducing the number of masks in the process. In addition, the light shielding layer 130 and the first body 1611 positioned on the inorganic layer 120 in the anode 161 are disposed in the same layer, and the light shielding layer 130 and the first body 1611 are insulated and separated by the buffer layer 141. This facilitates an electrical connection between the anode 161 and the source-drain layer 146.

In other embodiments, the light shielding layer 130 and the inorganic layer 120 are arranged in the same layer, that is, the arrangement position of the inorganic layer 120 corresponds to the arrangement position of the first body 1611 of the anode 161. This achieves planarization of the surface of the first body 1611 and isolates the base substrate 110 from the first body 1611. Therefore, impurity ions in the base substrate 110 are prevented from entering the first body 1611, thereby ensuring the normal display of the display panel 100. In this process, after the inorganic layer 120 is formed on the base substrate 110, the inorganic layer 120 needs to be patterned, and only the part corresponding to the first body 1611 is retained. This structural design helps to reduce the overall thickness of the display panel 100.

It is noted that the anode layer 160 in the embodiment of the present application may be a double-layer structure. The side of the anode layer 160 close to the base substrate 110 is a reflective layer such as silver, which has a reflective effect, and the side of the anode layer 160 away from the base substrate 110 is a transparent electrode such as indium tin oxide, wherein the reflective layer and the transparent electrode form the anode layer 160. The reflective layer can reflect the light irradiated by the external environment, which plays the role of shielding light and preventing the external environment light from affecting the display effect of the display panel 100.

Therefore, the anode layer 160 itself has the function of shielding light. When the light shielding layer 130 is patterned, the patterned light shielding layer 130 can be arranged around the area where anode 161 is located, and the side of the anode 161 facing the base substrate 110 does not need to be provided with the light shielding layer 130 separately.

Optionally, as shown in FIG. 7, the display panel 100 includes a passivation layer 150 disposed on the thin film transistor layer 140 to separate the thin film transistor layer 140 from subsequent film layers. A second opening 151 is defined on the passivation layer 150 at a position corresponding to the first opening 147, and the second opening 151 communicates with the first opening 147 to expose the corresponding inorganic layer 120.

Wherein, a third opening 152 is defined on the passivation layer 150 at a position corresponding to the source electrode. The second body 1613 of the anode 161 is positioned on the passivation layer 150, and the second body 1613 is electrically connected to the source electrode through the third opening 152. The connection part 1612 of the anode 161 is positioned on the sidewalls of the first opening 147 and the second opening 151 to realize the electrical connection between the anode 161 and the source electrode. That is, after the passivation layer 150 is formed on the thin film transistor layer 140, an anode layer 160 is deposited so that the first body 1611 of the anode 161 in the anode layer 160 is positioned on the exposed inorganic layer 120. The second body 1613 is positioned on the passivation layer 150, and the connecting part 1612 is positioned on the sidewalls of the first opening 147 and the second opening 151 and connects the first body 1611 and the second body 1613.

It should be noted that, because the connecting part 1612 of the anode 161 is positioned on the sidewalls of the first opening 147 and the second opening 151, the climbing height of the connecting part 1612 between the first body 1611 and the second body 1613 is made larger. In the process of forming the second opening 151 on the passivation layer 150, a step can be formed between the side wall of the first opening 147 and the side wall of the second opening 151 so that a buffer effect can be produced on the step during the deposition of the anode 161. This reduces the risk of fracture of the connecting part 1612 of the anode 161 on the sidewalls of the first opening 147 and the second opening 151.

Optionally, as shown in FIG. 1 to FIG. 3, the display panel 100 further includes a pixel definition layer 170 and a light emitting layer 180. The pixel definition layer 170 is positioned on the passivation layer 150, a fourth opening 171 is defined on the pixel defining layer 170, and the fourth opening 171 exposes the first body 1611 of the anode 161 to define a region where the light-emitting pixel is located. The light emitting layer 180 is positioned on the first body 1611, and by inputting a control signal on the first body 1611 of the anode 161, the light-emitting mode of the light emitting layer 180 can be regulated.

Wherein, when the fourth opening 171 is formed on the pixel definition layer 170, the fourth opening 171 only exposes the first body 1611, that is, the pixel definition layer 170 covers the second body 1613 of the anode 161 and the connection part 1612 so that the light emitting layer 180 is only in contact with the first body 1611 of the anode 161. Because the first body 1611 is positioned on the inorganic layer 120, the surface flatness of the first body 1611 is good, which is beneficial to ensure the thickness uniformity of the light emitting layer 180, thereby helping to improve the display unevenness of the display panel 100.

In some embodiments, the sidewalls of the fourth opening 171 formed on the pixel definition layer 170 are stepped, and the fourth opening 171 gradually expands along the direction away from the base substrate 110. In addition, the material used for the pixel definition layer 170 is hydrophobic. When the light emitting layer 180 is formed on the first body 1611 by inkjet printing, even if there is a certain deviation in the position of the printing nozzles, the printing ink can flow into the fourth opening 171 along the side wall of the fourth opening 171. Thus, the thickness uniformity of the entire light emitting layer 180 is ensured, and the display effect of the display panel 100 is improved.

Optionally, as shown in FIG. 6, the buffer layer 141 in the thin film transistor layer 140 is defined with a first sub-opening 1471, and the first sub-opening 1471 exposes the inorganic layer 120. A second sub-opening 1472 is defined on the second insulating layer 145 at a position corresponding to the first sub-opening 1471. The first sub-opening 1471 and the second sub-opening 1472 form the first opening 147 in the thin film transistor layer 140.

In other words, the first opening 147 on the thin film transistor layer 140 is not formed at one time. Instead, when forming the corresponding film layer of the thin film transistor layer 140, an opening is formed in the corresponding region while the film layer is patterned. When the formation of thin film transistor layer 140 is completed, the first opening 147 is also formed. This design eliminates the need to separately form the first opening 147 after the thin film transistor layer 140 is formed, thereby saving the number of masks, and simplifying the manufacturing process of the display panel 100.

In some embodiments, as shown in FIG. 2, a fifth opening 1411 is defined on the buffer layer 141, and the fifth opening 1411 exposes the light shielding layer 130. The second body 1613 of the anode 161 is positioned on the buffer layer 141, and the second body 1613 is electrically connected to the light shielding layer 130 through the fifth opening 1411. The connecting part 1612 is positioned on the sidewall of the first sub-opening 1471 and is electrically connected to the light shielding layer 130 through the second body 1613.

This design makes the second body 1613 of the anode 161 and the active layer 142 in the thin film transistor layer 140 arranged in the same layer. Compared with arranging the second body 1613 on the passivation layer 150, the overall thickness of the display panel 100 can be reduced. In addition, the second body 1613 is only positioned on the sidewall of the first sub-opening 1471. Compared with the design that the second body 1613 is positioned on the side wall of the first opening 147 and the side wall of the second opening 151, the climbing height of the connecting part 1612 can be reduced, and the risk of fracture of the connecting part 1612 can be reduced.

In other embodiments, as shown in FIG. 3, a sixth opening 1451 is defined on the second insulating layer 145. The sixth opening 1451 exposes the light shielding layer 130, and the second body 1613 of the anode 161 is positioned on the second insulating layer 145. The second body 1613 is electrically connected to the light shielding layer 130 through the sixth opening 1451, and the connecting part 1612 is positioned on the sidewalls of the first sub-opening 1471 and the second sub-opening 1472. The second body 1613 is electrically connected to the light shielding layer 130, and the light shielding layer 130 is electrically connected to the source electrode. This realizes the electrical connection between anode 161 and the source electrode.

This design makes the second body 1613 of the anode 161 and the source-drain layer 146 of the thin film transistor layer 140 arranged in the same layer. Compared with arranging the second body 1613 on the passivation layer 150, the overall thickness of the display panel 100 can be reduced. In addition, the second body 1613 is positioned on the sidewalls of the first sub-opening 1471 and the second sub-opening 1472, that is, the second body 1613 is only positioned on the side wall of the first opening 147. Compared with the design that the second body 1613 is positioned on the side walls of the first opening 147 and the second opening 151, the climbing height of the connecting part 1612 can be reduced, and the risk of the connecting part 1612 being fractured is reduced.

It should be noted that when the first sub-opening 1471 and the second sub-opening 1472 are formed, a step is formed between the side wall of the second sub-opening 1472 and the side wall of the first sub-opening 1471, that is, the entire first opening 147 gradually expands in the direction away from the base substrate 110. Wherein, the cross-sectional area of the side of the second sub-opening 1472 close to the first sub-opening 1471 is larger than the cross-sectional area of the side of the first sub-opening 1471 facing the second sub-opening 1472.

When the connecting part 1612 is only positioned on the sidewall of the first sub-opening 1471, the step is used for arranging the second body 1613 of the anode 161, so that the second body 1613 and the active layer 142 are arranged in the same layer. When the connecting part 1612 is positioned on the side walls of the first sub-opening 1471 and the second sub-opening 1472, the step can have a buffering effect on the connecting part 1612. This prevents the connecting part 1612 from climbing too high to cause fracture and ensures the stability of the overall structure of the anode 161.

Optionally, the material of the inorganic layer 120 includes one or more of amorphous silicon, silicon nitride, silicon oxide, or silicon oxynitride. Using this inorganic material to form the inorganic layer 120 can prevent the impurity ions in the base substrate 110 from entering the second body 1613 of the anode 161 while ensuring that the surface of the inorganic layer 120 has low roughness and high flatness. Thus, impurity ions in the base substrate 110 are prevented from affecting the display effect of the display panel 100.

Optionally, the thickness of the inorganic layer 120 is greater than or equal to 50 nm and less than or equal to 1000 nm. If the thickness of the inorganic layer 120 is too small, it may not be able to effectively planarize the surface of the base substrate 110 and isolate the impurity ions in the base substrate 110. If the thickness of the inorganic layer 120 is too large, the overall thickness of the display panel 100 will be too large, which is not conducive to the slim design of the display panel 100.

In the actual manufacturing process, the thickness of the inorganic layer 120 can be set to 50 nm, 100 nm, 200 nm, 500 nm, 800 nm, 1000 nm, or the like. It can not only ensure the planarization effect of the inorganic layer 120 on the surface of the base substrate 110 and the isolation effect on the impurity ions in the base substrate 110 but also can prevent the overall thickness of the display panel 100 from being too large. The specific value of the thickness of the inorganic layer 120 can be adjusted according to the actual situation, which is not particularly limited herein.

Furthermore, the embodiments of the present application provide a display device, the display device includes a display panel, and the specific structure of the display panel refers to the above-mentioned embodiments. Because the display device adopts all the technical solutions of the aforesaid embodiments, it has at least all the beneficial effects brought about by the technical solutions of the embodiments, which will not be repeated herein.

Figure 4:
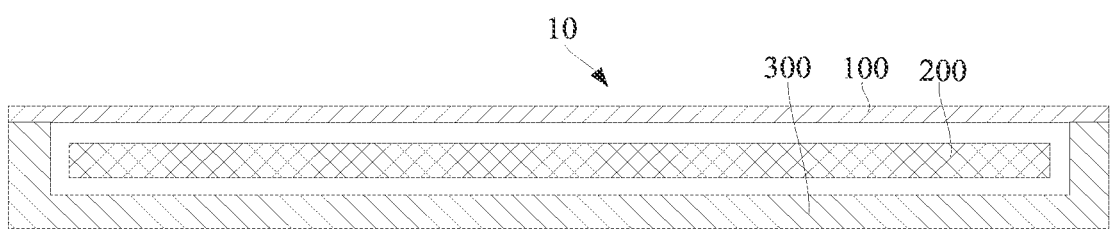
FIG. 4 is a schematic structural diagram of a display device provided by an embodiment of the present application.

As shown in FIG. 4, the display device 10 includes a display panel 100, a control circuit 200, and a casing 300. Wherein, the casing 300 is connected to the display panel 100 to support and fix the display panel 100, the control circuit 200 is arranged in the casing 300, and the control circuit 200 is electrically connected to the display panel 100 to control the display panel 100 to display images.

The display panel 100 may be fixed to the casing 300 to form a whole with the casing 300, and the display panel 100 and the casing 300 form a closed space for accommodating the control circuit 200. The control circuit 200 may be the main circuit board of the display device 10. In addition, the control circuit 200 may also be integrated with one or more functional components such as a battery, an antenna structure, a microphone, a speaker, a headphone interface, a universal serial bus interface, a camera, a distance sensor, an ambient light sensor, and a processor, etc. so that the display device 10 can be adapted to various application fields.

It should be noted that the display device 10 is not limited to the above contents, and may also include other devices, such as a camera, an antenna structure, a fingerprint unlocking module, etc., to expand its use range, which is not limited herein.

The display device 10 in the embodiment of the present application has a wide range of applications, including flexible displays and lighting such as televisions, computers, mobile phones, foldable and rollable display screens, etc., and wearable devices such as smart bracelets, smart watches, etc. All of them fall within the scope of application of the display device 10 in the embodiment of the present application.

Figure 5:
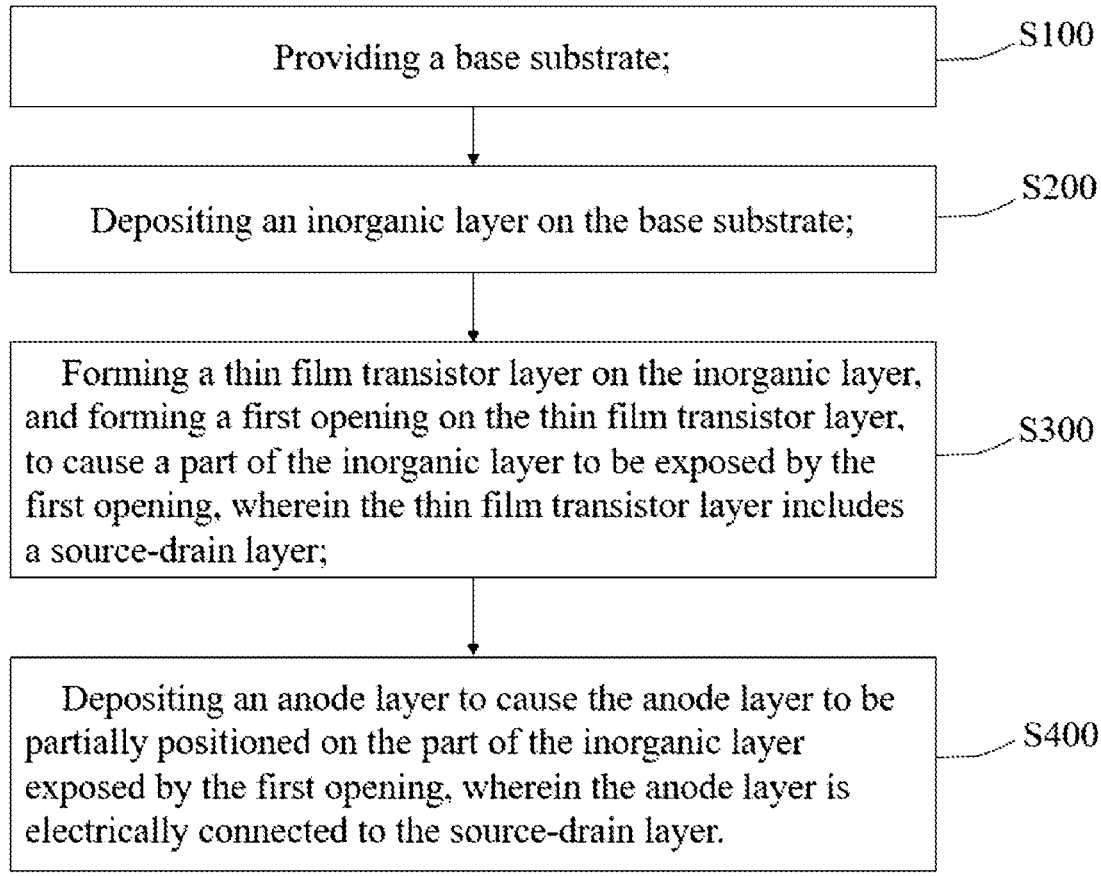
FIG. 5 is a flowchart of a method of manufacturing a display panel provided by an embodiment of the present application.

Finally, the embodiment of the present application further provides a method of manufacturing a display panel, which can be used to manufacture the display panel 100 in the above-mentioned embodiment. As shown in FIG. 5, the method of manufacturing the display panel mainly includes the following steps:

S100, providing a base substrate 110.

When manufacturing the display panel 100, a base substrate 110 needs to be provided first, and the base substrate 110 needs to be cleaned so that other functional structural layers can be formed on the base substrate 110. The base substrate 110 is used as a support structure of the display panel 100 to support other functional structural layers disposed on the base substrate 110 to ensure the overall structural stability of the display panel 100. The base substrate 110 may be a glass substrate or a substrate of other materials, which is not limited herein.

S200, depositing an inorganic layer 120 on the base substrate 110.

After the base substrate 110 is formed, an inorganic layer 120 is deposited on the base substrate 110. Because the surface of the inorganic layer 120 has small roughness and good flatness, arranging the inorganic layer 120 on the base substrate 110 can planarize the surface of the base substrate 110. The inorganic layer 120 and the base substrate 110 can be regarded as a planarization layer, which is helpful for the formation of subsequent film layers.

Wherein, when the inorganic layer 120 is formed on the base substrate 110, the inorganic layer 120 can be provided on the entire surface of the base substrate 110 to reduce the number of masks. Alternatively, the inorganic layer 120 may be patterned according to requirements, and only part of the inorganic layer 120 is retained to reduce the overall thickness of the display panel 100. The specific setting method can be selected according to the actual design requirements, and no special restrictions are made herein.

S300, forming a thin film transistor layer 140 on the inorganic layer 120, and forming a first opening 147 on the thin film transistor layer 140 to cause a part of the inorganic layer 120 to be exposed by the first opening 147, wherein the thin film transistor layer 140 includes a source-drain layer 146.

As shown in FIG. 6, after the inorganic layer 120 is formed on the base substrate 110, a thin film transistor layer 140 is formed on the inorganic layer 120, and a first opening 147 is formed on the thin film transistor layer 140 so that the first opening 147 exposes a part of the inorganic layer 120 to facilitate the formation of subsequent film layers on the inorganic layer 120. The thin film transistor layer 140 includes a source-drain layer 146, and the source-drain layer 146 is used to connect with other film layers to realize the control of the thin film transistor layer 140 on other film layers.

S400, depositing an anode layer 160 to cause the anode layer 160 to be partially positioned on the part of the inorganic layer 120 exposed by the first opening 147, wherein the anode layer 160 is electrically connected to the source-drain layer 146.

As shown in FIG. 7, after the formation of the thin film transistor layer 140 is completed, a layer of anode layer 160 is continuously deposited so that the anode layer 160 is partially positioned on the part of the inorganic layer 120 exposed by the first opening 147. Because the inorganic layer 120 has small roughness and good flatness, the flatness of the anode layer 160 on the inorganic layer 120 is also good, which helps to improve the uniformity of the subsequent film layers, thereby improving the problem of display unevenness of the display panel 100.

In addition, since the base substrate 110 contains various impurity ions, by arranging the inorganic layer 120 on the base substrate 110, the base substrate 110 can also be separated from the corresponding anode layer 160. This can prevent impurity ions in the base substrate 110 from entering the anode layer 160, thereby preventing the display effect of the display panel 100 from being affected.

The anode layer 160 is electrically connected to the source-drain layer 146 in the thin film transistor layer 140 so that the anode layer 160 is electrically connected to the corresponding thin film transistors in the thin film transistor layer 140. This realizes the control of turn-on and turn-off of the signal on the anode layer 160, thereby realizing the regulation of the display mode of the display panel 100.

It should be noted that the electrical connection between the anode layer 160 and the source-drain layer 146 may be that the anode layer 160 and the source-drain layer 146 are directly connected. Alternatively, the anode layer 160 is indirectly connected to the source-drain layer 146 through other structures, and the connection way is related to the specific structural design of the anode layer 160.

Optionally, the source-drain layer 146 includes a source electrode, the anode layer 160 includes an anode 161, and the anode 161 includes a first body 1611, a connecting part 1612, and a second body 1613 connected in sequence. The first body 1611 is positioned on a part of the inorganic layer 120 exposed by the first opening 147, and is used for the formation of subsequent film layers on the anode layer 160. The connecting part 1612 is positioned on the side wall of the first opening 147 to facilitate the connection of the first body 1611 and other structures. The second body 1613 is electrically connected to the source-drain layer 146 to realize the electrical connection between the anode 161 and the source-drain layers 146.

Specifically, as shown in FIG. 8, a layer of anode layer 160 is deposited in step S400, so that the anode layer 160 is partially positioned on a part of the inorganic layer 120 exposed by the first opening 147, wherein the anode layer 160 is electrically connected to the source-drain layer 146, which mainly includes the following steps:

S410, forming a passivation layer 150 on the thin film transistor layer 140, forming a second opening 151 on the passivation layer 150 at a position corresponding to the first opening 147, and forming a third opening 152 on the passivation layer 150 at a position corresponding to the source electrode.

After the thin film transistor layer 140 is formed on the inorganic layer 120, a passivation layer 150 needs to be formed on the thin film transistor layer 140 to separate the thin film transistor layer 140 from subsequent film layers. A second opening 151 is formed on the passivation layer 150 at a position corresponding to the first opening 147, and the second opening 151 is communicated with the first opening 147, so that the corresponding inorganic layer 120 is exposed, which facilitates the formation of subsequent film layers on the inorganic layer 120. A third opening 152 is formed on the passivation layer 150 at a position corresponding to the source electrode to expose the source electrode to facilitate the connection between the subsequent film layer and the source electrode.

S420, depositing an anode layer 160 on the passivation layer 150 to cause the first body 1611 to be positioned on the part of the inorganic layer 120 exposed by the first opening 147, cause the connecting part 1612 to be positioned on a side wall of the first opening 147 and a side wall of the second opening 151, and cause the second body 1613 to be positioned on the passivation layer 150. wherein the second body 1613 is electrically connected to the source electrode through the third opening 152.

After the formation of the passivation layer 150 is completed, an anode layer 160 is deposited on the passivation layer 150, so that the first body 1611 is positioned on the inorganic layer 120 exposed by the first opening 147, thereby ensuring the flatness of the first body 1611. This facilitates the formation of subsequent film layers on the first body 1611. The connecting part 1612 is positioned on the side walls of the first opening 147 and the second opening 151, the second body 1613 is positioned on the passivation layer 150, and the second body 1613 is electrically connected to the source electrode through the third opening 152, thereby realizing the electrical connection between the anode 161 and the source electrode.

Wherein, because the connecting part 1612 of the anode 161 is positioned on the sidewalls of the first opening 147 and the second opening 151 at the same time, the climbing height of the connecting part 1612 between the first body 1611 and the second body 1613 is relatively large. In the process of forming the second opening 151 on the passivation layer 150, a step can be formed between the sidewall of the first opening 147 and the sidewall of the second opening 151, so that a buffer effect can be generated on the step during the deposition of the anode 161. This reduces the risk of fracture of the connecting part 1612 of the anode 161 on the sidewalls of the first opening 147 and the second opening 151.

It should be noted that the electrical connection between the anode 161 and the source electrode may be the direct connection between the anode 161 and the source electrode. Alternatively, the anode 161 is indirectly connected to the source electrode through other structures, and the connection way is related to the specific structural design of the anode 161. Wherein, the arrangement position of the second body 1613 can be adjusted according to the connection way between the anode 161 and the source electrode. When the arrangement position of the second body 1613 changes, the formation area of the connecting part 1612 on the sidewall of the first opening 147 also changes accordingly to ensure the electrical connection between the entire anode 161 and the source electrode.

Optionally, the thin film transistor layer 140 includes a buffer layer 141, an active layer 142, a first insulating layer 143, a gate layer 144, a second insulating layer 145, and a source-drain layer 146, which are sequentially disposed along a direction away from the light shielding layer 130. A first sub-opening 1471 is defined on the buffer layer 141, and the first sub-opening 1471 exposes the inorganic layer 120. A second sub-opening 1472 is defined on the second insulating layer 145 at a position corresponding to the first sub-opening 1471. The first sub-opening 1471 and the second sub-opening 1472 form the first opening 147 in the thin film transistor layer 140.

In some embodiments, the buffer layer 141 is defined with a fifth opening 1411, and the fifth opening 1411 exposes the light shielding layer 130. When depositing the anode layer 160, the first body 1611 is positioned on a part of the inorganic layer 120 exposed by the first opening 147, the second body 1613 is positioned on the buffer layer 141 and is electrically connected to the light shielding layer 130 through the fifth opening 1411. The connecting part 1612 is positioned on the sidewall of the first sub-opening 1471 and is electrically connected to the light shielding layer 130 through the second body 1613. The light shielding layer 130 is electrically connected to the source electrode to realize the electrical connection between the anode 161 and the source electrode.

This design makes the second body 1613 of the anode 161 and the active layer 142 of the thin film transistor layer 140 disposed in the same layer. Compared with arranging the second body 1613 on the passivation layer 150, the overall thickness of the display panel 100 can be reduced. In addition, the second body 1613 is only positioned on the sidewall of the first sub-opening 1471. Compared with the design that the second body 1613 is positioned on the side walls of the first opening 147 and the second opening 151, the climbing height of the connecting part 1612 can be reduced, and the risk of fracture of the connecting part 1612 is reduced.

In other embodiments, the second insulating layer 145 is defined with a sixth opening 1451, and the sixth opening 1451 exposes the light shielding layer 130. When depositing the anode layer 160, the first body 1611 is positioned on the part of the inorganic layer 120 exposed by the first opening 147. The second body 1613 is positioned on the second insulating layer 145 and is electrically connected to the light shielding layer 130 through the sixth opening 1451. The connecting part 1612 is positioned on the sidewalls of the first sub-opening 1471 and the second sub-opening 1472 and is electrically connected to the light shielding layer 130 through the second body 1613. The light shielding layer 130 is electrically connected to the source electrode to realize the electrical connection between the anode 161 and the source electrode.

This design makes the second body 1613 of the anode 161 and the source-drain layer 146 of the thin film transistor layer 140 disposed in the same layer. Compared with arranging the second body 1613 on the passivation layer 150, the overall thickness of the display panel 100 can be reduced. In addition, the second body 1613 is positioned on the sidewalls of the first sub-opening 1471 and the second sub-opening 1472, that is, the second body 1613 is only positioned on the side wall of the first opening 147. Compared with being positioned on the side walls of the first opening 147 and the second opening 151, the climbing height of the connecting part 1612 can be reduced. This reduces the risk of fracture of the connecting part 1612.

It should be noted that when the first sub-opening 1471 and the second sub-opening 1472 are formed, a step is formed between the side wall of the second sub-opening 1472 and the side wall of the first sub-opening 1471, that is, the overall first opening 147 gradually expands in the direction away from the base substrate 110, and the cross-sectional area of the side of the second sub-opening 1472 close to the first sub-opening 1471 is larger than the cross-sectional area of the side of the first sub-opening 1471 facing the second sub-opening 1472.

When the connecting part 1612 is only positioned on the sidewall of the first sub-opening 1471, the step is used for arranging the second body 1613 of the anode 161, so that the second body 1613 and the active layer 142 are arranged in the same layer. When the connecting part 1612 is positioned on the sidewalls of the first sub-opening 1471 and the second sub-opening 1472. The step can produce a buffering effect on the connecting part 1612, prevent the connecting part 1612 from being broken due to an excessively large climbing height, and ensure the stability of the overall structure of the anode 161.

Optionally, the manufacturing method of the display panel 100 in the embodiment of the present application further includes the manufacture of the pixel definition layer 170 and the light emitting layer 180. The specific steps include: First, forming a pixel definition layer 170 on the passivation layer 150, and forming a fourth opening 171 on the pixel definition layer 170 so that the fourth opening 171 exposes the first body 1611, and then the light emitting layer 180 is formed on the first body 1611.

Wherein, when the fourth opening 171 is formed on the pixel definition layer 170, the fourth opening 171 only exposes the first body 1611, that is, the pixel definition layer 170 covers the second body 1613 of the anode 161 and the connecting part 1612 so that the light emitting layer 180 is only in contact with the first body 1611 of the anode 161. Because the first body 1611 is positioned on the inorganic layer 120, the surface flatness of the first body 1611 is better. It is beneficial to ensure the thickness uniformity of the light emitting layer 180, thereby helping to improve the problem of uneven display of the display panel 100.

In some embodiments, the sidewalls of the fourth opening 171 formed on the pixel definition layer 170 are stepped, and the fourth opening 171 gradually expands along the direction away from the base substrate 110. In addition, the material of the pixel definition layer 170 is hydrophobic. When the light emitting layer 180 is formed on the first body 1611 by inkjet printing, even if there is a certain deviation in the position of the printing nozzles, the printing ink can flow into the fourth opening 171 along the side wall of the fourth opening 171. Thus, the thickness uniformity of the entire light emitting layer 180 is ensured, and the display effect of the display panel 100 is improved.

Optionally, in the embodiment of the present application, before forming the thin film transistor layer 140, the formation of the light shielding layer 130 is further included. By forming the light shielding layer 130 between the base substrate 110 and the thin film transistor layer 140, the light shielding layer 130 can be used to shield the external ambient light. This can prevent the external ambient light from irradiating the active layer 142 from affecting the structure of the active layer 142, thereby preventing the normal use of the thin film transistor layer 140 from being affected.

In some embodiments, the light shielding layer 130 is positioned on the inorganic layer 120, that is, the inorganic layer 120 is disposed on the entire surface of the base substrate 110. This makes it unnecessary to pattern the inorganic layer 120 after depositing one layer of the inorganic layer 120 on the base substrate 110 so that the number of masks used in the process is reduced. In addition, the light shielding layer 130 and the first body 1611 of the anode 161 positioned on the inorganic layer 120 are arranged in the same layer, and the light shielding layer 130 and the first body 1611 are insulated and separated by the buffer layer 141. This facilitates the electrical connection between the anode 161 and the source-drain layer 146.

In other embodiments, the light shielding layer 130 and the inorganic layer 120 are arranged in the same layer, that is, the arrangement position of the inorganic layer 120 corresponds to the arrangement position of the first body 1611 of the anode 161. This achieves planarization of the surface of the first body 1611 and isolates the base substrate 110 from the first body 1611. Therefore, impurity ions in the base substrate 110 are prevented from entering the first body 1611, thereby ensuring the normal display of the display panel 100. In this process, after the inorganic layer 120 is formed on the base substrate 110, the inorganic layer 120 needs to be patterned, and only the part corresponding to the first body 1611 is retained. This structural design helps to reduce the overall thickness of the display panel 100.

It is noted that the anode layer 160 in the embodiment of the present application may be a double-layer structure. The side of the anode layer 160 close to the base substrate 110 is a reflective layer such as silver, which has a reflective effect, and the side of the anode layer 160 away from the base substrate 110 is a transparent electrode such as indium tin oxide, wherein the reflective layer and the transparent electrode form the anode layer 160. The reflective layer can reflect the light irradiated by the external environment, which plays the role of shielding light and preventing the external environment light from affecting the display effect of the display panel 100.

Therefore, the anode layer 160 itself has the function of shielding light. When the light shielding layer 130 is patterned, the patterned light shielding layer 130 can be arranged around the area where anode 161 is located, and the side of the anode 161 facing the base substrate 110 does not need to be provided with the light shielding layer 130 separately.

The display panel, the display device, and the manufacturing method of the display panel provided by the embodiments of the present application have been described in detail above. The principles and implementations of the present application are described with specific embodiments herein. The descriptions of the embodiments are only used to help understand the method of the present application and its core idea. In addition, for one skill in the art, according to the idea of the present application, there will be changes in the specific embodiments and the scope of this application. In conclusion, the content of this specification should not be construed as a limitation on the present application.

What is claimed is:

1. A display panel, comprising:
a base substrate;
an inorganic layer disposed on the base substrate;
a thin film transistor layer comprising a source-drain layer and a buffer layer, wherein the thin film transistor layer is disposed on the inorganic layer and defined with a first opening exposing a part of the inorganic layer; and
an anode layer, wherein the anode layer comprises an anode comprising a first body, a connecting part, and a second body connected in sequence, wherein the first body is positioned on the part of the inorganic layer exposed by the first opening, the connecting part is positioned on a side wall of the first opening, and the second body is electrically connected to the source-drain layer;
wherein the display panel comprises a light shielding layer disposed on the inorganic layer, the light shielding layer and the first body are positioned in a same layer and are separated by the buffer layer.

2. The display panel of claim 1, wherein the thin film transistor layer comprises the buffer layer, an active layer, a first insulating layer, a gate layer, a second insulating layer, and the source-drain layer sequentially arranged in a direction away from the light shielding layer, wherein the source-drain layer comprises a source electrode electrically connected to the light shielding layer.

3. The display panel of claim 2, further comprising a passivation layer disposed on the thin film transistor layer, wherein a second opening is defined on the passivation layer at a position corresponding to the first opening, and a third opening is defined on the passivation layer at a position corresponding to the source electrode, wherein the second body of the anode is positioned on the passivation layer and is electrically connected to the source electrode through the third opening, and wherein the connecting part of the anode is positioned on the side wall of the first opening and a side wall of the second opening.

4. The display panel of claim 3, further comprising a pixel definition layer and a light emitting layer, wherein the pixel definition layer is positioned on the passivation layer, a fourth opening exposing the first body is defined on the pixel definition layer, and wherein the light emitting layer is positioned on the first body.

5. The display panel of claim 2, wherein a first sub-opening exposing the inorganic layer is defined on the buffer layer, a second sub-opening is defined on the second insulating layer at a position corresponding to the first sub-opening, and the first sub-opening and the second sub-opening form the first opening, and wherein a fifth opening exposing the light shielding layer is defined on the buffer layer, the second body of the anode layer is positioned on the buffer layer, the second body is electrically connected to the light shielding layer through the fifth opening, and the connecting part is positioned on a side wall of the first sub-opening.

6. The display panel of claim 2, wherein a first sub-opening exposing the inorganic layer is defined on the buffer layer, a second sub-opening is defined on the second insulating layer at a position corresponding to the first sub-opening, and the first sub-opening and the second sub-opening form the first opening, and wherein a sixth opening exposing the light shielding layer is defined on the second insulating layer, the second body of the anode layer is positioned on the second insulating layer, the second body is electrically connected to the light shielding layer through the sixth opening, and the connecting part is positioned on a side wall of the first sub-opening and a side wall of the second sub-opening.

7. The display panel of claim 1, wherein a material of the inorganic layer comprises one or more materials selected from amorphous silicon, silicon nitride, silicon oxide, or silicon oxynitride.

8. The display panel of claim 1, wherein a thickness of the inorganic layer is greater than or equal to 50 nm and less than or equal to 1000 nm.

9. A display device, comprising the display panel of claim 1.

10. A method of manufacturing a display panel, comprising:
providing a base substrate;
depositing an inorganic layer on the base substrate;
forming a thin film transistor layer on the inorganic layer, and defining a first opening on the thin film transistor layer to expose a part of the inorganic layer, wherein the thin film transistor layer comprises a source-drain layer; and
depositing an anode layer to cause the anode layer to be partially disposed on the part of the inorganic layer exposed by the first opening and cause the anode layer to be electrically connected to the source-drain layer;
wherein the source-drain layer comprises a source electrode, the anode layer comprises an anode, and the anode comprises a first body, a connecting part, and a second body connected in sequence, wherein the step of depositing the anode layer to cause the anode layer to be partially disposed on the part of the inorganic layer exposed by the first opening and cause the anode layer to be electrically connected to the source-drain layer comprises:
forming a passivation layer on the thin film transistor layer, defining a second opening on the passivation layer at a position corresponding to the first opening, and defining a third opening on the passivation layer at a position corresponding to the source electrode; and
depositing the anode layer on the passivation layer to cause the first body to be positioned on the part of the inorganic layer exposed by the first opening, cause the connecting part to be positioned on a side wall of the first opening and a side wall of the second opening, and cause the second body to be positioned on the passivation layer, wherein the second body is electrically connected to the source electrode through the third opening.

11. The method of manufacturing the display panel of claim 10, further comprising:
forming a pixel definition layer on the passivation layer, and defining a fourth opening exposing the first body on the pixel definition layer; and
forming a light emitting layer on the first body.

12. A display panel, comprising:
a base substrate;
an inorganic layer disposed on the base substrate;
a thin film transistor layer comprising a source-drain layer and disposed on the inorganic layer, wherein the thin film transistor layer is defined with a first opening exposing a part of the inorganic layer;
an anode layer, wherein the anode layer comprises an anode comprising a first body, a connecting part, and a second body connected in sequence, wherein the first body is positioned on the part of the inorganic layer exposed by the first opening, the connecting part is positioned on a side wall of the first opening, and the second body is electrically connected to the source-drain layer; and
a light shielding layer positioned between the base substrate and the thin film transistor layer; wherein the thin film transistor layer comprises a buffer layer, an active layer, a first insulating layer, a gate layer, a second insulating layer, and the source-drain layer sequentially arranged in a direction away from the light shielding layer, wherein the source-drain layer comprises a source electrode electrically connected to the light shielding layer, and wherein the light shielding layer is positioned on the inorganic layer or is positioned in a same layer as the inorganic layer;
wherein a first sub-opening exposing the inorganic layer is defined on the buffer layer, a second sub-opening is defined on the second insulating layer at a position corresponding to the first sub-opening, and the first sub-opening and the second sub-opening form the first opening, and wherein a fifth opening exposing the light shielding layer is defined on the buffer layer, the second body of the anode layer is positioned on the buffer layer, the second body is electrically connected to the light shielding layer through the fifth opening, and the connecting part is positioned on a side wall of the first sub-opening.

13. The display panel of claim 12, further comprising a passivation layer disposed on the thin film transistor layer, a pixel definition layer and a light emitting layer, wherein the pixel definition layer is positioned on the passivation layer, a second opening exposing the first body is defined on the pixel definition layer, and wherein the light emitting layer is positioned on the first body.

14. The display panel of claim 12, wherein a material of the inorganic layer comprises one or more materials selected from amorphous silicon, silicon nitride, silicon oxide, or silicon oxynitride.

15. The display panel of claim 12, wherein a thickness of the inorganic layer is greater than or equal to 50 nm and less than or equal to 1000 nm.

\* \* \* \* \*